United States Patent

Mills, Jr. et al.

[11] Patent Number: 5,847,442
[45] Date of Patent: *Dec. 8, 1998

[54] STRUCTURE FOR READ-ONLY-MEMORY

[75] Inventors: Allen Paine Mills, Jr., Chatham; Philip Moss Platzman, Short Hills, both of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 748,035

[22] Filed: Nov. 12, 1996

[51] Int. Cl.$^6$ .................................................. H01L 29/00
[52] U.S. Cl. ........................ 257/536; 257/380; 257/758
[58] Field of Search ................................. 257/536–538, 257/639–643, 758–760, 763, 764, 380–381, 904

[56] References Cited

U.S. PATENT DOCUMENTS

| | | | |
|---|---|---|---|
| 4,675,848 | 6/1987 | Karp et al. | 365/189 |
| 4,727,045 | 2/1988 | Cheung et al. | 437/47 |
| 5,281,843 | 1/1994 | Ochi et al. | 257/904 |
| 5,306,936 | 4/1994 | Goto | 257/641 |
| 5,394,356 | 2/1995 | Yang | 257/381 |
| 5,404,046 | 4/1995 | Matsumoto et al. | 257/758 |
| 5,416,736 | 5/1995 | Kosa et al. | 257/904 |
| 5,436,506 | 7/1995 | Kim et al. | 257/904 |
| 5,523,600 | 6/1996 | Kapoor | 257/904 |
| 5,541,442 | 7/1996 | Keil et al. | 257/536 |
| 5,545,584 | 8/1996 | Wuu et al. | 437/52 |
| 5,554,867 | 9/1996 | Ajika et al. | 257/758 |
| 5,596,212 | 1/1997 | Kuriyama | 257/904 |
| 5,608,670 | 3/1997 | Akaogi et al. | 365/185.23 |
| 5,625,215 | 4/1997 | Chen et al. | 257/904 |

FOREIGN PATENT DOCUMENTS 404017366  1/1992  Japan .................................... 257/904

*Primary Examiner*—Mark V. Prenty

[57] ABSTRACT

A read-only memory having sets of word lines and bit lines orthogonal to each other and separated by an insulator. At specific cell sites, selected by a memory algorithm, a word line is connected to bit lines by a doped or undoped polysilicon data resistor. The use of a data resistor, rather the an active device such as a MOSFET, provides a saving in space by a factor of four. The polysilicon data resistor may have a range of values, the minimum of which is determined by the number of cell sites and the resistance of the word and bit lines. The maximum value of the data resistor is determined by thermal noise considerations. Within this range, the data resistors may also have discrete values so that more than one data level may be stored at a cell site, to provide even greater storage density.

31 Claims, 2 Drawing Sheets

STRUCTURE FOR READ-ONLY-MEMORY

BACKGROUND OF THE INVENTION

1. Field of the Invention

This invention relates to a read-only-memory (ROM) and, more particularly, to one which employs a doped polysilicon post as a resistive element between its word lines and bit lines.

2. Description of Related Art

A read-only-memory stores instructions and information such as mathematical functions and data code in binary form. The storage is permanent because the information is encoded into the ROM during the fabrication process. The ROM consists of a planar array of parallel word lines which are perpendicular to and insulated from a planar array of parallel bit lines, the two planes containing the lines being parallel to each other and separated by an insulating layer. Active semiconductor devices such as bi-polar transistors or metal oxide semiconductor field effect transistors (MOSFETs) interconnect the junction of each word line and each bit line to form a memory cell. The presence or absence of a device at each cell determines whether a logic "1" or "0" is stored in the cell. In the fabrication process, all the cells are usually populated with devices for economy of scale, and then a link to a particular device is opened in the encoding process. The control electrode (base or gate) of the active device is usually connected to the word line, and the emitter or source electrode is usually connected to the bit line, for transistor or MOSFET devices, respectively. A positive potential on a word line turns devices which exist at a cell "on" while there is no change at cells where the links have been removed. The bit lines are then read in parallel to obtain a group of "1" and "0" signals which form the output of the ROM. The art of ROMs is well known.

More broadly based consumer applications for a ROM can be envisioned as the capacity of the memory enlarges with advances in semiconductor lithography and fabrication. For example, compact disk players require a mechanical player to provide a constant velocity to every part of the recording track. The players are relatively fragile and are possibly not compatible with operation during movement. If a ROM could store about an hour of music with the same quality as a compact disk, a new commercial market could be developed.

The storage capacity of a ROM is related to the minimum feature size or "design rule" used in fabricating the chip as well as to the complexity of the active circuit which interconnects the word and bit lines. The design rule has decreased in four increments from one micron to 0.35 micron, where each of the increments quadrupled the size of memories, from 1 Megabit to 64 Megabits. Further reductions to 0.25 micron and 0.18 micron design rules are anticipated. The area occupied by each cell is also proportional to the complexity of the active device, and the minimum area required by a MOSFET cell is $A=16\lambda^2$ where $\lambda$ is the design rule dimension.

Accordingly, there is a need in the art to continue to reduce the design rule and also to simplify the structure of the element which interconnects the word and bit lines to achieve a higher memory density. It would also be desirable to continue to use existing semiconductor technology and benefit from advances in lithographic design rules. The ability to store more than a single bit at a cell site would also increase the storage density on the chip. The ROM should be readable with electronics on the same chip, be small, portable, and rugged, and be capable of storing about one hour of music, perhaps with the aid of compression algorithms.

SUMMARY OF THE INVENTION

The present invention relates to a read-only-memory which employs a polysilicon post as a resistive element between its word and bit lines. The polysilicon posts are either doped or undoped.

In one embodiment of the invention a set of word lines are spaced apart and parallel to each other and are separated by an insulator from a set of bit lines which are orthogonal to the word lines. The projected intersection of each word line and bit line forms a cell site, and apertures in the insulator are created at selected cell sites determined by a memory algorithm representing the data to be stored. A data resistor is deposited within each aperture and it connects a word line to a bit line at that cell site. Inputs are provided from an n-stage ring counter which sequentially drives each of a set of drivers which are connected to a word line. Each bit line is connected to a sense amplifier which connects to a discriminator which detects the presence or absence of a data resistor at cell sites on the driven line. The bit lines are read in parallel and fed to an output shift register. Each word line is supported by a first insulator. To benefit from existing semiconductor processing technology, the insulators are typically silicon dioxide or silicon nitride and the word lines are made from a refractory metal silicide to withstand further processing. The data resistors, made from doped polysilicon, fill the set of apertures and interconnect selected word and bit lines. The data resistors span a range of values. The minimum resistance value is determined by the number of cell sites and the resistance of the word and bit lines. The output impedance of each driver and the input impedance of each sense amplifier is less then the resistance of a word line or a bit line, respectively. The maximum resistance value is determined by thermal noise considerations.

In another embodiment of the invention, the value of each data resistor is selected from a set of discrete values to provide multi-level data depths at each cell site. The selection of discrete values is determined by the tolerance achievable over all the data resistors, the permissible error rate, and the range of usable resistor values. The discrete values of resistance at each cell site may be achieved by varying the doping level of the polysilicon forming each data resistor, by varying the size of the aperture at each cell site and keeping the doping level constant, or by selectively varying the annealing temperature of each cell.

In a further embodiment of the invention, at least one set of bit lines and at least one set of word lines are deposited on a layer insulator which is supported by a first level of bit lines and a first insulator. A first set of word lines is under the first insulator. Apertures filled with conductive posts connect all the word lines to drivers and all the bit lines to sense amplifiers. Resistors interconnect selected word and bit lines according to the data to be stored. The resistors may be single valued or multi-valued to provide multi-level data depths at each cell site.

The advantages to using a doped or undoped polysilicon post as a resistor to interconnect word and bit lines are a decrease in the area of a cell as compared to using an active device and simplified processing, and the ability to create a series of discrete resistance values at each cell site further increases the density of information which may be stored per unit area of memory.

DETAILED DESCRIPTION OF THE PREFERRED EMBODIMENTS

The storage capacity of a ROM is related to the physical space the memory segment occupies on a chip, the size of the smallest lithographic feature (design rule, $\lambda$,), and the complexity of the element which interconnects word (input) lines and bit (output) lines. Where active devices provide this interconnection, the minimum area occupied by a MOSFET cell is $A=16\lambda^2$. There are also a significant number of processing steps in creating a three terminal MOSFET, with each step providing an opportunity for diminished yield which correlates to higher cost.

Where an active MOSFET is replaced by a simple resistor, the active area occupied by a cell is reduced to $A=4\lambda^2$. Further advantages include simplified lithography, hence higher yield and lower cost. The reduction in area by a factor of four by incorporating a resistor is equivalent to that which is achieved by the next generation of lithography with the next smaller design rules.

Figure 1:
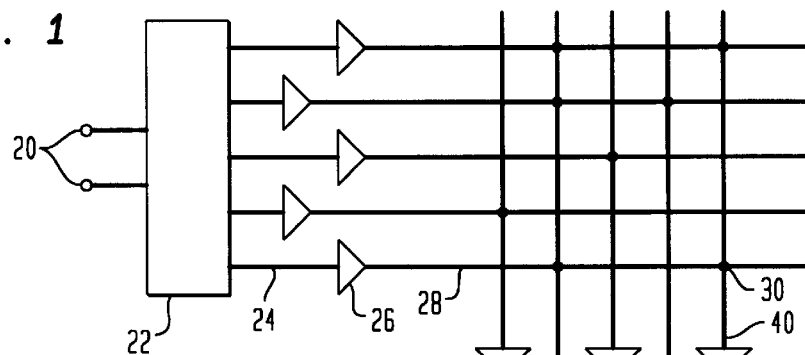
FIG. 1 is a plan view of one embodiment of the invention.

Referring now to FIG. 1, there is shown a circuit diagram of a ROM. Inputs 20 provide instructions to an n-stage ring counter (shift register) 22 having a series of outputs 24, each of which is connected to a driver 26. The output impedance of each driver is much less than the impedance of each of a set of word lines 28. The drivers are usually in a low output state and each driver is turned on to an output voltage, $V_o$, one at a time. The word lines are insulated from a set of bit lines 40, except at selected cell sites where a connection is made between a specific word line and a specific bit line by a data resistor, R, 30. The location of these fixed data resistors is determined by a memory algorithm representing the data to be stored in the ROM. Each bit line feeds a sense amplifier 42, whose input impedance is much less than the impedance of each bit line. The sense amplifiers are feedback operational amplifiers having a feedback resistance, $R_f=R$ which is made of materials which are similar to R so that any temperature dependence of resistivity will not greatly affect the amplifier gain. Conductor 44 connects each sense amplifier to a discriminator 46 which senses whether each amplifier output is less than or greater than a preset threshold voltage. After a predetermined on-chip delay, the discriminator outputs are loaded onto output shift register 50 by conductors 48. The shift register is read one bit at a time at output 60 at a rate which is determined by an output clock (not shown).

The use of a resistor to interconnect word and bit lines in a ROM is well known. For example, a resistor memory matrix circuit has been described by W. T. Lynch, "Worst-Case Analysis of a Resistor Memory Matrix", IEEE Transactions on Computers, Vol. C-18, October, 1969, pages 940–942. This circuit analysis considers the relationship between the value of the data resistor and the impedances of the drivers and sense amplifiers to provide an acceptable signal to noise ratio. David and Feldman also describe a resistor matrix and calculate signal to noise ratios in terms of the value of the data resistor and the driver and sensor impedances ("High Speed Fixed Memories Using Large-Scale Integrated Resistor Matrixes", IEEE Transactions on Computers, Vol. C-17, No. 8, 1968, pages 721–728). Each of these references discusses the use of thin film resistors such as vanadium oxide or tin oxide deposited on a substrate such as glass. The use of thin film resistors has the possible disadvantage of requiring increased area for high valued resistors, whereas the use of three-dimensional doped polysilicon posts can achieve high resistance values in a constant diameter, as will be shown below.

Figure 2:
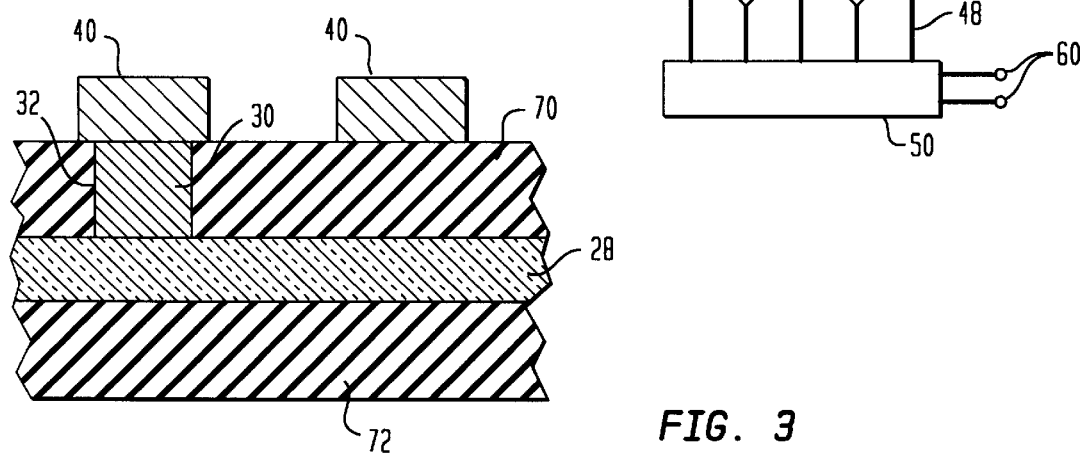
FIG. 2 is a cross-sectional view of that embodiment.

Referring now to FIG. 2, there is shown a cross section of one embodiment of the invention wherein one of a series of word lines 28 is supported by insulator 72. Insulator 70 is supported in part by word lines 28 and in part by insulator 72. The pattern formed by word lines 28 is typically, but not necessarily, one of approximately equal lines and equal spaces between them. Insulator 70 defines an aperture 32 which is typically formed by lithographic masking and etching operations which are well known and which produce approximately vertical sidewalls. Data resistor 30 is deposited within and retained by the aperture, making contact to a word line. A series of bit lines 40, parallel to each other and perpendicular to word lines 28 cover and make electrical contact to the data resistor and are also supported by insulator 70. The locations of the set of apertures 32 and data resistors 30 are determined by the data to be stored in the ROM. FIG. 2 shows one cell site where a connection is made between one of the set of bit lines 40 and word line 28, and one cell site where no connection is made because the data resistor is absent. The positions of the word and the bit lines could be interchanged. In a preferred embodiment which takes advantage of silicon processing technology, insulator 72 is silicon oxide which is grown or deposited upon a silicon substrate. Word line 28 may be formed from a refractory metal nitride or silicide, such as, but not limited to, TiN or $WSi_x$. The nitride or silicide being selected to withstand high temperature processing. Insulator 70 may, for example, be silicon oxide which is deposited over word lines 28 and insulator 72. Data resistor 30 is doped or undoped polysilicon with a controlled resistivity. The doping elements being selected from the group of elements consisting of boron, phosphorous, arsenic, and antimony. Bit lines 40 are deposited last, so they may be made of an aluminum alloy or any other metallic conductor such as titanium, titanium nitride or aluminum.

Several design considerations determine the value of data resistor 30, R. One consideration is the resistance of a word line, $r_w$, and the resistance of a bit line, $r_b$. These resistances are determined by the line geometry and the resistivity of their material. For example, assume that the area occupied by the intersection of $n_w$ word lines and $n_b$ bit lines is 0.5 cm by 0.5 cm, and that the design rule, $\lambda$, is 0.25 micron. Further assume that the thickness of each line and insulator 70 is equal to $\lambda$, providing an easy to etch aspect ratio of one-to-one. The length of each conductor, L=0.5 cm, by our assumption, so the maximum resistance of each line is then $$r_w = \rho_w L/A \text{ or } r_b = \rho_b L/A \qquad (1)$$

where $\rho_w$ and $\rho_b$ are the resistivities of the word and bit materials, respectively, and A is the line's area perpendicular to the current flow. This expression can be normalized in terms of the design parameters $n_w$, $n_b$ and $\lambda$ to express the wire resistance as $$r_w = 2 \, n_w \, \rho/\lambda \text{ and } r_b = 2 \, n_b \, \rho/\lambda \qquad (2)$$

Aluminum films have a resistivity of $4(10)^{-6}$ ohm-cm and the refractory metal alloys have a resistivity of $10(10)^{-6}$ ohm-cm, so the bit and word lines have resistances of approximately 3 K$\Omega$ and 8 K$\Omega$, respectively, assuming $n=n_w \approx n_b \approx 10^4$.

The discriminator needs to sense the presence of a resistor at a cell site with sufficient precision to resolve one bit of data. We assume that the output impedance of each driver and the input impedance of each sense amplifier is much less than $r_w$ or $r_b$, respectively, and that the data is sufficiently ideal so that approximately half of the sites are occupied by data resistors in a random distribution. Then, the minimum resistance of data resistor 30 is given by $$R_{min} > \alpha [n_b n_w r_b r_w]^{0.5}, \text{ where } \alpha \cong 1 \quad (3)$$

For a 0.25 micron design rule, the bit lines are 0.5 micron on centers, and a 0.5 cm wide array contains $(10)^4$ bit lines. The minimum value for data resistor 30 then becomes 50 MΩ.

The maximum value for data resistor 30 is determined principally by the need for sufficient signal to give adequate signal to noise performance. Each word and bit line has a distributed capacitance, and the propagation of a signal through them is governed by the well known telegraph equations for distributed R-C lines. The time constant to charge each line is about $r_w C$. The capacitance for each line is given by $$C = \epsilon A/d \quad (4)$$

where $\epsilon$ is the permittivity of insulator 70. The time constant is approximately 10 ns, which is fast compared to the integration time required to reduce thermal noise.

So the principal factor limiting the maximum value of data resistor 30 is thermal noise contributed by the impedance on the input of each sense amplifier 42. We assume that half of the n sites along a bit line are occupied by data resistors in parallel, each of which couples to a word line that terminates in a low impedance driver. This impedance becomes 2R/n. The data current into each sense amplifier is approximately $V_o/R$, where $V_o$ is the driver output voltage. This should be at least 10 times the thermal noise which is given by $$I_{n(RMS)} = [4kTf/2R/n]^{0.5} \quad (5)$$

where k is Boltzman's constant, T is the absolute temperature, f is the bandwidth of the sense amplifier, and n is the number of lines in a square memory array.

The signal to noise ratio then becomes $$S/N = I_s/I_{n(RMS)} = V_o/[2RnfkT]^{0.5} \quad (6)$$

from which the maximum value of the data resistor becomes $$R_{max} < V_o^2/2nfkT(S/N)^2 \quad (7)$$

which becomes $R_{max} < 3$ GΩ given $f=10^6$/s, T=300K, $n=n_w \cong n_b \cong 10^4$, $V_o=5$V and S/N=10.

Since the choices of driver voltage and the temperature are relatively inflexible, the maximum value of the data resistor is determined by the inverse of the following: the number of lines, the upper frequency of the read out, and the square of the signal to noise ratio desired.

Minimum and maximum values for the data resistor may be determined for other size memories with different design rules, different read speeds, and different error specifications by following the previous examples.

Figure 3:
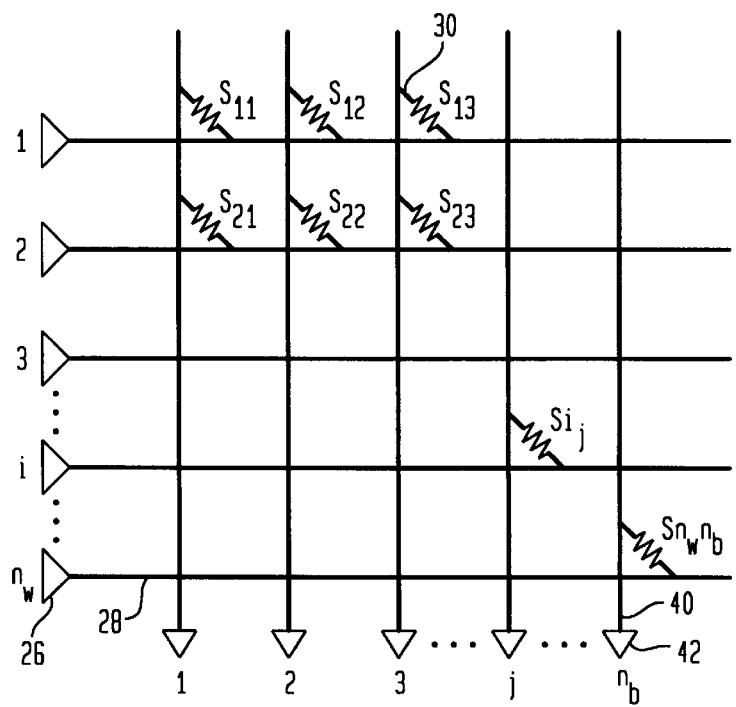
FIG. 3 is a plan view of another embodiment of the invention.

Referring now to FIG. 3, there is shown another embodiment of the invention, wherein each data resistor 30 is not single-valued to provide for a one bit memory level, but it has one of a set of values of conductance $S_{ij}$ at each cell site to provide multi-level data depths within the same area as hitherto described. A set of $n_w$ drivers 26 are connected to a set of $n_w$ word lines 28 which are insulated from an orthogonal set of $n_b$ bit lines 40 which are connected to a set of $n_b$ sense amplifiers 42, just as in FIG. 1. The word lines and bit lines are connected at each cell site by a data resistor 30 whose cross section is shown in FIG. 2.

The selection of the resistance values (reciprocal of conductance) is determined by the resistance tolerance which is achievable over all the data resistors, the permissible error rate, and the decay of the signals due to the multiple paths in the network. If η is the fractional standard deviation of the resistor values due to uncertainties in the manufacturing process, a possible set of conductance values is given by $$S_p = R_o^{-1} e^{-\xi \eta p} \quad (8)$$

where ξ is chosen to make confusion of one resistor value with another improbable, and p=0, 1, 2, 3, etc. A 3% standard deviation (η=0.03) has been achieved for a 22×22 array of resistors. For ξ=10, only one in $(10)^6$ resistors will have an incorrect value.

Thus, for a two bit data depth level the resistance ratios would be $R = R_o[1.0, 1.3, 1.7, \text{ and } \infty]$ and for a three bit data depth level the resistor ratios would be $R = R_o[1.0, 1.3, 1.7, 2.2, 2.9, 3.7, 4.8, \text{ and } \infty]$, here the value R=∞ denotes the absence of a connection.

As in the previous embodiment, the minimum resistance may be determined from $R_o > \alpha [n_b n_w r_b r_w]^{0.5}$, where $\alpha \cong 1$ and where $1/R_o$ is two times the average of the conductances $S_p$. The maximum value of $R_o$ is determined by the acceptable error rate, thermal noise, and the sampling rate as given in equation 7.

The physical creation of the several resistance values may be achieved in three ways. First, the size of the aperture containing the data resistor may be kept the same as in FIGS. 1 and 2. That is, the aperture diameter will be approximately λ. The doping levels driven into the resistor material by ion implantation will be varied to provide for different conductivities for each data resistor 30. This is accomplished with masking steps which limit the doping level to each resistor according to the data to be stored. All the data resistors will obviously be annealed in the same thermal cycle.

A second method to achieve multiple data resistor values is to adjust their diameters from a minimum diameter equal to the design rule, λ, and to increase that diameter in as many steps as required by the data level. This method has the advantage of having only one implant step, but it has a disadvantage of increasing the pitch between adjacent word and bit lines to accommodate the wider diameters. For example, a two bit data level would require an area ratio between the lowest resistor value and the highest one which is equal to 1.7. This translates to a diameter ratio of 1.3, which means that the line widths will be increased from 0.25 micron to 0.33 micron. The spacing between the lines will remain at λ=0.25 micron, and the resulting pitch will become 0.58 micron. For the same memory area, 0.5 cm by 0.5 cm, the number of lines with the increased pitch in each direction is reduced from $(10)^4$ to $8.6(10)^3$. The number of cell sites in this area are $(10)^8$ and $7.4(10)^7$, respectively. A figure of merit is the number of addresses times the $\log_2$ of the number of resistor values discernible at each address, which becomes $(10)^8$ and $1.5(10)^8$ for one bit and two bit data levels, respectively.

A third way to achieve a discrete set of data resistor values is to keep the doping level and diameter of the resistor constant and vary the annealing cycle at each address. This can be accomplished by a programmed laser beam which is focused on each address and which applies a various levels of thermal energy, either by varying the intensity of the beam or by varying the duration of time the beam heats the resistor.

Interconnecting the word lines and bit lines with a data resistor having selected resistor values possess the possible advantage of increasing the data density over both a single valued resistor and also significantly increasing the data density over a ROM having active devices such as a MOSFET having a binary output.

Figure 4:
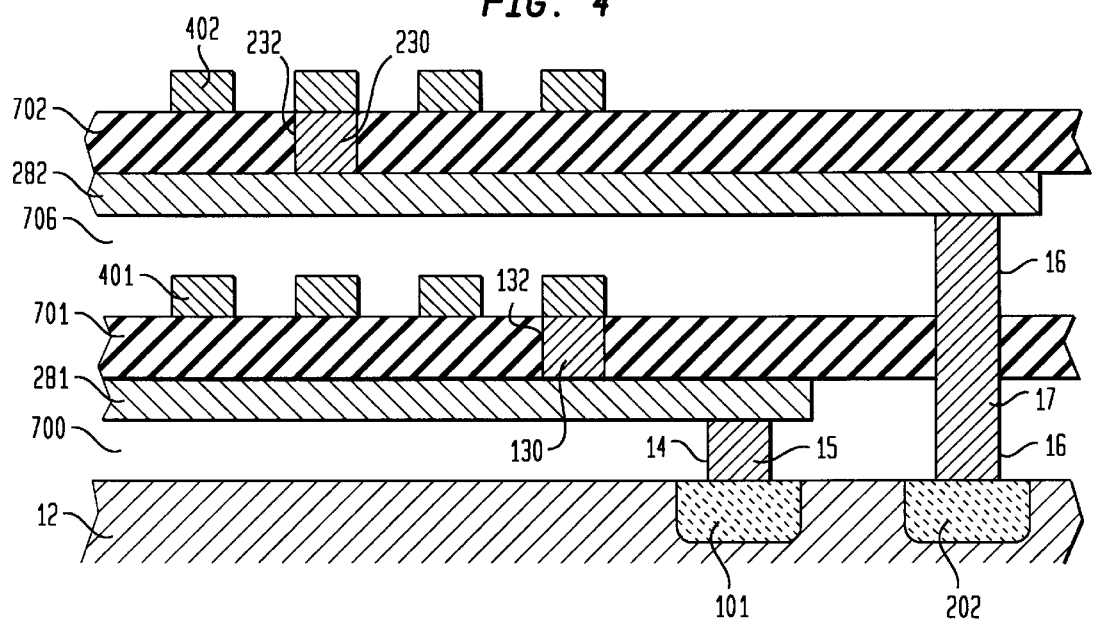
FIG. 4 is a cross-sectional view of a further embodiment of the invention.

Referring now to FIG. 4, there is shown a further embodiment of the invention wherein sets of word lines and bit lines are deposited over each other to form a multilevel structure. Substrate 12 supports bottom insulator 700 which defines apertures 14 and 16 which restrain conductor posts 15 and 17. The substrate may be any semiconductor into which first level electrode 101 and second level electrode 202 are formed by conventional masking and implant or diffusion steps. These electrodes are the outputs of drivers such as those shown in FIG. 1. One of a first set of n word lines, first word line 281, and one of a second set of word lines, second word line 282, connect to conductive posts 15 and 17, respectively. First insulator 701 is supported in part by the first set of word lines, and in part by bottom insulator 700. The first insulator supports a first set of m bit lines 401, and also defines a first set of apertures 132 which restrain a first set of data resistors 130. The apertures and data resistors are located at cell sites according to the data to be stored in the ROM just as in FIG. 1. Layer insulator 706 covers the first set of bit lines and the first insulator, and it also defines aperture 16 which restrains conductive post 17. One of a second set of word lines, second word line 282 is supported by the layer insulator and connects to conductive post 17. Second insulator 702 covers the second set of word lines in part, and the layer insulator, in part, and it also defines a set of apertures 232, one of which is shown restraining one of a set of data resistors, data resistor 230, according to a pattern determined by the data to be stored. A second set of bit lines 402 are supported by the second insulator and are normal to the second set of word lines. Data resistor 230 is shown connecting a second bit line to second word line 282. The sets of data resistors, exemplified by data resistor 130 and data resistor 230 may be single valued as in FIG. 1, or they may be multi-valued as in FIG. 3. Conductive posts 15 and 17 may be a metal or doped polysilicon. The first set of bit lines and the second set of bit lines, which are shown normal to the plane of FIG. 4, connect to a set of bit electrodes (not shown) in substrate 12 via a set of apertures and conductive posts similar to those shown for the word lines. The set of bit electrodes feed into a set of sense amplifiers as shown in FIG. 1. Additional sets of bit lines and word lines may be layered over those shown in FIG. 4 by depositing another layer insulator such as layer insulator 706 and repeating the depositions and etchings.

Figure 5:
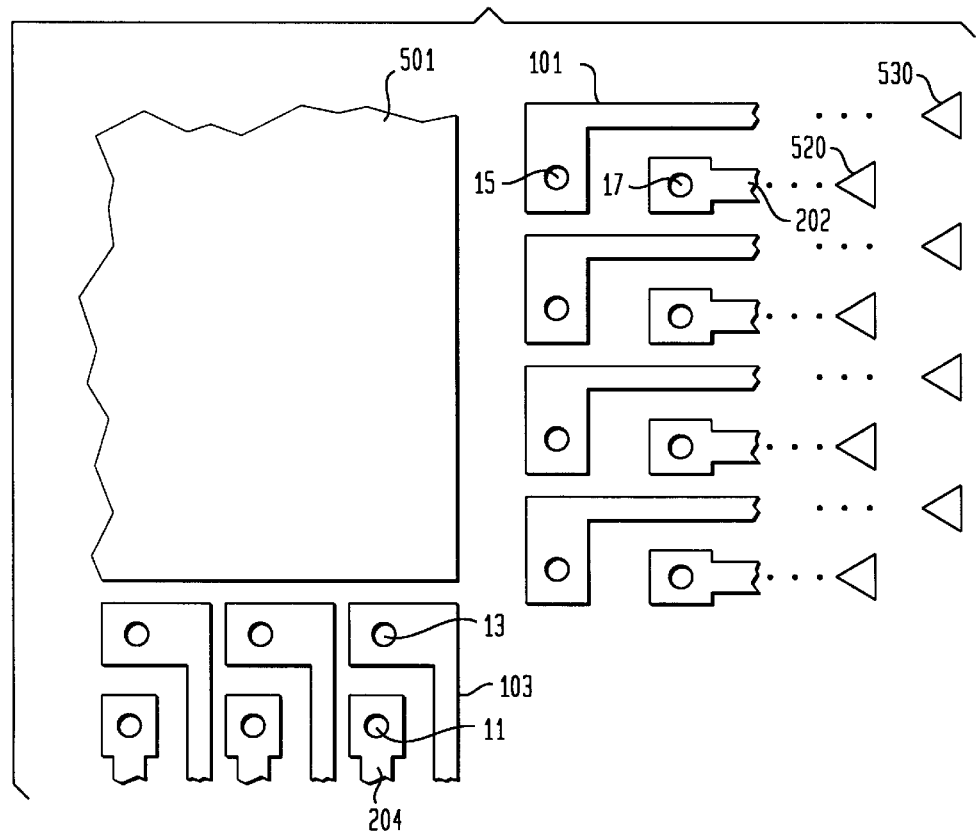
FIG. 5 is a plan view of that embodiment.

Referring now to FIG. 5, there is shown a plan view of the structure of FIG. 4 revealing some additional elements not discernible in the latter figure. Area 501 contains the multilevel array of n×m cell sites shown in cross-section in FIG. 4. First level word lines emanating from area 501 (not shown) each connect to one of a first set of conductive posts 15, each of which connects to one of a set of n first level word electrodes 101, each of which is driven by one of a set of first level drivers 530. Similarly, each second level word line (not shown) emanating from area 501 contacts one of a third set of conductive posts 17, each of which contacts one of a set of second word electrodes 202, each of which is driven by one of a set of second level drivers 520. Each first level bit line (not shown) emanating from area 501 contacts one of a second set of conductive posts 13, each of which contacts one of a set of first level bit electrodes 103. Similarly, each second level bit line (not shown) emanating from area 501 contacts one of a set of conductive posts 11, each of which contacts one of a set of second bit electrodes 204. All the bit electrodes ultimately connect to sense amplifiers (not shown).

Changes and modifications in the previously described embodiments may be carried out without departing from the scope of the invention. In particular, the relative positions of word and bit lines may be interchanged in any of the embodiments.

We claim:

1. A structure for a read-only-memory comprising:

a first insulator;

a set of word lines, spaced apart and parallel to each other, supported by the first insulator;

a second insulator, supported in part by the set of word lines and supported in part by the set of word lines and supported in part by the first insulator, defining a series of apertures adapted to provide access through the second insulator to the set of word lines;

a set of data resistors, adapted to fit within the apertures defined in the second insulator, contacting the set of word lines;

a set of bit lines, spaced apart and parallel to each other, being orthogonal to and separated from the set of word lines, supported in part by the second insulator and supported in part by the set of data resistors, being adapted to contact any one data resistor of the set of data resistors;

wherein the projected intersection of each word line and each bit line forms a passive device cell site, the apertures and data resistors being located only at cell sites which are predetermined by a memory algorithm.

2. The structure of claim 1 wherein the first insulator is selected from a group consisting of silicon nitride and silicon oxide.

3. The structure of claim 1 wherein the second insulator is selected from a group consisting of silicon nitride and silicon oxide.

4. The structure of claim 1 wherein the second insulator is an organic material.

5. The structure of claim 1 wherein the word lines are comprised of a refractory metal silicide.

6. The structure of claim 1 wherein the data resistors are formed from undoped polysilicon posts.

7. The read-only memory of claim 1 wherein the data resistors are formed from doped polysilicon.

8. The read-only memory of claim 7 wherein doping elements in the polysilicon are selected from a group consisting of boron, phosphorous, arsenic, and antimony.

9. The read-only memory of claim 1 wherein the minimum resistance of any data resistor is determined by the number of bit lines, the number of word lines, the resistance of a word line, and the resistance of a bit line.

10. The read-only memory of claim 1 wherein the minimum resistance of any data bit resistor is determined by $R_{min} > [n_b n_w r_b r_w]^{0.5}$ where $n_b$ and $n_w$ represent the number of bit lines and word lines, respectively, and $r_b$ and $r_w$ represent the resistances of a bit line and a word line, respectively.

11. The read-only memory of claim 1 wherein the maximum resistance of any data resistor is determined by the number of word lines, the number of bit lines, the rate at which data is retrieved from the memory, and an acceptable signal to noise ratio.

12. The read-only memory of claim 1 wherein the maximum resistance of any data resistor is given by $R_{max} < V_o^2/2nfkT(S/N)^2$ where Vo is a voltage impressed upon a word line, n is the number of lines in a square array, k is Boltzman's constant, T is the absolute temperature, S/N is a signal to noise ratio and f is a rate at which data is read out of the memory.

13. A read-only-memory comprising:
   a set of word lines, spaced apart and parallel to each other;
   a set of bit lines, spaced apart and parallel to each other, being orthogonal to and separated from the set of word lines, the projected intersection of each word line and each bit line defining a memory cell; and
   a set of data resistors, arranged to interconnect a word line to a bit line at passive device cell sites which are predetermined by a memory algorithm;
   wherein each of the data resistors at a cell site has a conductance selected from a set of values adapted to provide multi-level data depths at each cell site which is occupied by a data resistor.

14. The read-only memory of claim 13 wherein the set of values is determined by a tolerance which is achievable over the set of data resistors, a permissible error rate, and a range of usable resistor values.

15. The read-only memory of claim 14 wherein the set of values is determined by $S_p = R_o^{-1} e^{-\xi \eta p}$ where $\xi$ is a factor to make confusion of one resistor with another improbable, $\eta$ is the fractional standard deviation of a Gaussian distribution, p=0,1,2,3 . . . , and $R_o$ is a minimum value of a data resistor.

16. The read-only memory of claim 15 wherein the minimum resistance of any data resistor is determined by the number of bit lines, the number of word lines, the resistance of a word line, and the resistance of a bit line.

17. The read-only memory of claim 13 wherein the minimum resistance of any data bit resistor is determined by $R_{min} > \beta [n_b n_w r_b r_w]^{0.5}$ where $n_b$ and $n_w$ represent the number of bit lines and word lines, respectively, and $r_b$ and $r_w$ represent the resistances of a bit line and a word line, respectively, and $\beta$ is a factor of order one pertaining to the distribution of resistor values.

18. The read-only memory of claim 14 wherein the maximum resistance of any data resistor is determined by the number of word lines, the number of bit lines, the rate at which data is retrieved from the memory, and an acceptable signal to noise ratio.

19. The read-only memory of claim 14 wherein the maximum resistance of any data resistor is given by $R_{max} < \beta V_o^2/2nfkT(S/N)^2$ where Vo is a voltage impressed upon a word line, n is the number of lines in a square array, k is Boltzman's constant, T is the absolute temperature, f is a rate at which data is read out of the memory, S/N is a signal to noise ratio and $\beta$ is a factor of order one pertaining to the distribution of resistor values.

20. A structure for a read-only-memory comprising:
   a substrate having a set of first level word electrodes, a set of second level word electrodes, a set of first level bit electrodes, and a set of second level bit electrodes;
   a bottom insulator supported in part by the substrate and supported in part by the sets of first level word electrodes, second level word electrodes, first level bit electrodes, and second level bit electrodes, defining a series of apertures over each set of said electrodes;
   a set of first word lines, spaced apart and parallel to each other;
   a first set of conductive posts interconnecting each first word line to a first level word electrode, being adapted to fit within the apertures over the first level word electrodes;
   a first level insulator, supported in part by the set of first word lines and supported in part by the bottom insulator, defining a series of apertures over the sets of second level word electrodes, second level bit electrodes, and first level bit electrodes, and defining a first series of data apertures over the first level word lines at cell sites which are predetermined by a memory algorithm;
   a first set of data resistors, being restrained by the first series of data apertures, adapted to contact the first word lines;
   a set of first bit lines, spaced apart and parallel to each other, being orthogonal to the set of first word lines, being supported in part by the first insulator and supported in part by the first set of data resistors to which the bit lines make contact;
   a second set of conductive posts interconnecting each first bit line to a first level bit electrode, being adapted to fit within the apertures over the first level bit electrodes;
   a layer insulator, supported in part by the first set of bit lines and supported in part by the first insulator, defining a series of apertures over the second level word electrodes and the second level bit electrodes;
   a set of second word lines, spaced apart and parallel to each other;
   a second insulator, supported in part by the set of second word lines and supported in part by the layer insulator, defining a series of apertures over the second level bit electrodes and defining a second series of data apertures over the second set of word lines at cell sites which are determined by a memory algorithm;
   a second set of data resistors, being restrained by the second series of data apertures, adapted to contact the second set of word lines;
   a second set of bit lines, spaced apart and parallel to each other, being orthogonal to the set of second of word lines, supported in part by the second insulator and supported in part by the second set of data resistors to which said bit lines make contact;
   a third set of conductive posts, interconnecting each second word line to a second level word electrode, being adapted to fit within the apertures over the second word electrodes; and
   a fourth set of conductive posts, interconnecting each second bit line to a second level bit electrode, being adapted to fit within apertures over the second level bit electrodes;
   wherein said cell sites do not contain active devices.

21. The structure of claim 20 wherein the minimum resistance of any data resistor is determined by $R_{min} > \alpha [n_b n_w r_b r_w]^{0.5}$, where $\alpha \cong 1$, $n_b$ and $n_w$ represent the number of bit lines and word lines, respectively, and $r_b$ and $r_w$ represent the resistances of a bit line and a word line, respectively.

22. The structure of claim 20 wherein the maximum resistance of any data resistor is determined by the number of word lines, the number of bit lines, the rate at which data is retrieved from the memory, and an acceptable signal to noise ratio.

23. The structure of claim 20 wherein the maximum resistance of any data resistor is given by $R_{max} < V_o^2/2nfkT\,(S/N)^2$ where Vo is a voltage impressed upon a word line, n is the number of lines in a square array, k is Boltzman's constant, T is the absolute temperature, S/N is a signal to noise ratio and f is a rate at which data is read out of the memory.

24. The structure of claim 20 wherein the data resistors are formed from doped polysilicon.

25. The structure of claim 20 wherein the substrate is a semiconductor.

26. The structure of claim 20 wherein the bottom insulator, first insulator, layer insulator, and second insulator are selected from a group consisting of silicon nitride and silicon oxide.

27. The structure of claim 20 wherein the first set of word lines, the first set of bit lines, and the second set of word lines are comprised of a refractory metal silicide.

28. The structure of claim 20 wherein the second set of bit lines are selected from a group consisting of titanium, titanium nitride and aluminum.

29. The structure of claim 20 wherein each data resistor has a doping level selected from a set of values.

30. The structure of claim 20 wherein each data resistor has a diameter selected from a set of values.

31. The structure of claim 20 wherein each data resistor has a laser annealing cycle selected to achieve a resistance selected from a set of values.

* * * * *